(12) United States Patent
Nakatani

(10) Patent No.: US 7,943,506 B2
(45) Date of Patent: May 17, 2011

(54) SEMICONDUCTOR DEVICE AND PRODUCTION METHOD THEREFOR

(75) Inventor: Goro Nakatani, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 210 days.

(21) Appl. No.: 12/078,268

(22) Filed: Mar. 28, 2008

(65) Prior Publication Data

US 2008/0188075 A1 Aug. 7, 2008

Related U.S. Application Data

(62) Division of application No. 10/912,218, filed on Aug. 6, 2004, now Pat. No. 7,372,163.

(30) Foreign Application Priority Data

Aug. 11, 2003 (JP) .................................. 2003-291642

(51) Int. Cl.
*H01L 21/4763* (2006.01)
(52) U.S. Cl. ........ 438/627; 438/648; 438/650; 438/653; 438/656; 438/686; 257/E21.168; 257/E21.169
(58) Field of Classification Search .................. 438/625, 438/627–628, 648, 650, 656, 685, 686, 653; 257/E21.168, E21.169
See application file for complete search history.

(56) References Cited

U.S. PATENT DOCUMENTS

| | | | |
|---|---|---|---|
| 5,712,509 A | 1/1998 | Harada et al. | |
| 6,521,532 B1 * | 2/2003 | Cunningham | 438/687 |
| 6,590,288 B1 * | 7/2003 | Woo et al. | 257/751 |
| 6,605,874 B2 | 8/2003 | Leu et al. | |
| 6,770,977 B2 | 8/2004 | Kishida et al. | |
| 2002/0132392 A1 * | 9/2002 | Nakatani et al. | 438/118 |
| 2003/0129826 A1 * | 7/2003 | Werkhoven et al. | 438/627 |
| 2005/0051899 A1 | 3/2005 | Nakatani et al. | |

FOREIGN PATENT DOCUMENTS

| | | |
|---|---|---|
| CN | 1414623 A | 4/2003 |
| JP | 04-082225 | 3/1992 |
| JP | 07-283219 | 10/1995 |
| JP | 8-293522 | 11/1996 |
| JP | 2000-331991 | 11/2000 |
| JP | 2001-053077 | 2/2001 |
| JP | 2002-217284 | 8/2002 |
| JP | 2003-100758 | 4/2003 |
| TW | 535462 | 6/2003 |

* cited by examiner

*Primary Examiner* — Mary Wilczewski
*Assistant Examiner* — Toniae M Thomas
(74) *Attorney, Agent, or Firm* — Rabin & Berdo, PC

(57) ABSTRACT

A semiconductor device provided with: a first interconnection layer provided on a semiconductor substrate; an interlevel insulation film provided over the first interconnection layer; a second interconnection layer of gold provided as an uppermost interconnection layer on the interlevel insulation film; and a barrier layer provided between the first interconnection layer and the second interconnection layer in an interlevel connection opening formed in the interlevel insulation film. The barrier layer includes a first sublayer provided in contact with the first interconnection layer to reduce a contact resistance, a second sublayer provided in contact with the second interconnection layer to improve a bonding strength, and a third sublayer provided between the first sublayer and the second sublayer. The first sublayer, the second sublayer and the third sublayer are, for example, a first tantalum sublayer, a second tantalum sublayer and a tantalum nitride sublayer, respectively.

6 Claims, 4 Drawing Sheets

SEMICONDUCTOR DEVICE AND PRODUCTION METHOD THEREFOR

This is a Divisional of U.S. application Ser. No. 10/912,218, filed Aug. 6, 2004, now U.S. Pat. No. 7,372,163 and allowed on Jan. 10, 2008, the subject matter of which is incorporated herein by reference.

BACKGROUND OF THE INVENTION

1. Field of the Invention

The present invention relates to a semiconductor device having a plurality of interconnection layers and to a production method for the semiconductor device.

2. Description of Related Art

Semiconductor devices generally include a semiconductor substrate, a functional device provided in a surface of the semiconductor substrate, and a multi-level interconnection structure provided on the semiconductor substrate. The multi-level interconnection structure typically includes a plurality of interconnection layers stacked with the intervention of interlevel insulation films, and connection between the interconnection layers is achieved through contact holes formed in the interlevel insulating films.

Aluminum is conventionally employed as an interconnection material, but has a limitation in reduction of the resistance of the interconnection. As the sectional area of the interconnection is reduced with microminiaturization of the semiconductor device, a problem associated with the resistance of the interconnection arises. Particularly, there is a demand for reduction of the resistances of a ground line and a power line.

In this connection, the inventor of the present invention, for example, has proposed in Japanese Unexamined Patent Publication (KOKAI) No. 2002-217284 that a gold layer is employed as an uppermost interconnection layer for the reduction of the resistance of the interconnection.

In this prior art, a barrier layer of a titanium thin film is disposed between an aluminum interconnection layer and the uppermost gold interconnection layer electrically connected to each other through a contact hole, so that migration of aluminum is prevented by the barrier layer.

However, gold is a highly diffusible material. Where the semiconductor device is allowed to stand at a high temperature for a long period of time (e.g., at 400° C. for 30 minutes to 1 hour) in an alloying process, for example, gold easily diffuses into the aluminum interconnection layer.

In addition, the titanium thin film has a poor anti-corrosion property. Where the semiconductor device is used in an environment like a pressure cooker test (PCT) environment, the aluminum interconnection layer is liable to be corroded, resulting in breakdown of the semiconductor device.

SUMMARY OF THE INVENTION

It is an object of the present invention to provide a semiconductor device and a production method therefor, which employ a gold interconnection layer, and yet satisfactorily prevent diffusion of gold and ensure a sufficient corrosion resistance.

A semiconductor device according to the present invention comprises: a first interconnection layer provided on a semiconductor substrate; an interlevel insulation film provided over the first interconnection layer; a second interconnection layer of gold provided as an uppermost interconnection layer on the interlevel insulation film; and a barrier layer provided between the first interconnection layer and the second interconnection layer in an interlevel connection opening formed in the interlevel insulation film. The barrier layer comprises a first sublayer provided in contact with the first interconnection layer to reduce a contact resistance, a second sublayer provided in contact with the second interconnection layer to improve a bonding strength, and a third sublayer provided between the first sublayer and the second sublayer.

The first sublayer, the second sublayer and the third sublayer are preferably a first tantalum sublayer, a second tantalum sublayer and a tantalum nitride sublayer, respectively.

With this arrangement, the barrier layer includes the first and second tantalum sublayers and the tantalum nitride sublayer provided between the first and second tantalum sublayers. Particularly, the tantalum nitride layer satisfactorily prevents gold of the second interconnection layer from diffusing into the first interconnection layer, and provides an excellent anti-corrosive effect.

The first tantalum sublayer contributes to the reduction of the contact resistance with respect to the first interconnection layer (for example, composed of aluminum), while the second tantalum sublayer contributes to the improvement of the bonding strength between the barrier layer and the second interconnection layer of gold. That is, if the first interconnection layer of aluminum contacts the tantalum nitride sublayer, a surface of the first interconnection layer is liable to be nitrided, thereby having an increased electrical resistance. This problem is solved by the provision of the first tantalum sublayer. Further, the gold layer does not have sufficient adhesion to the nitride film. This problem is solved by the provision of the second tantalum sublayer.

The use of the tantalum sublayers and the tantalum nitride sublayer in combination prevents the diffusion of gold with a smaller barrier layer thickness as compared with the use of the tantalum sublayer alone. More specifically, where the barrier layer is constituted by the tantalum sublayer alone, the barrier layer is required to have a thickness of about 4000 Å for the prevention of the diffusion of gold. On the contrary, the inventor of the present invention experimentally confirmed that, where the barrier layer has a structure such that the tantalum nitride sublayer is provided between the first and second tantalum sublayers, the barrier layer is merely required to have a thickness of about 2000 Å for the prevention of the diffusion of gold.

The tantalum nitride sublayer preferably has a nitrogen atom density distribution such that a portion of the tantalum nitride sublayer adjacent to the first tantalum sublayer has a lower nitrogen atom density than a portion of the tantalum nitride sublayer adjacent to the second tantalum sublayer. With this arrangement, the portion of the tantalum nitride sublayer adjacent to the first tantalum sublayer, i.e., on the side of the first interconnection layer, has a relatively low nitrogen atom density and, therefore, an increase in the electrical resistance of the first interconnection layer can be suppressed or prevented which may otherwise occur when nitrogen atoms reach the first interconnection layer.

The interlevel insulation film preferably comprises a silicon nitride film which entirely covers a surface of the interlevel insulation film. With this arrangement, the corrosion resistance can further be improved by the silicon nitride film which is highly dense and has a high passivation effect.

The semiconductor device preferably further comprises a polyimide resin film which covers the second interconnection layer and the interlevel insulation film. With this arrangement, the second interconnection layer of gold and the barrier layer which are excellent in corrosion resistance are entirely covered with the polyimide resin film which has a lower passivation effect, whereby the device can sufficiently be protected. In addition, the formation of the polyimide resin film can easily be achieved by a coating process, thereby facilitating the production process.

The semiconductor device preferably further comprises a silicon nitride film which covers the second interconnection layer and the interlevel insulation film. With this arrangement, the second interconnection layer and the interlevel insulation film are entirely covered with the silicon nitride film which has a higher passivation effect, whereby the device can sufficiently be protected.

A semiconductor device production method according to the present invention is adapted to produce a semiconductor device in which a first interconnection layer and a second interconnection layer stacked with the intervention of an interlevel insulation film are electrically connected to each other through an interlevel connection opening formed in the interlevel insulation film. This method comprises the steps of: forming the first interconnection layer on a semiconductor substrate; forming the interlevel insulation film to cover the first interconnection layer; forming the interlevel connection opening at a predetermined position in the interlevel insulation film to expose a part of the first interconnection layer; forming a barrier layer in the interlevel connection opening; and forming the second interconnection layer of gold as an uppermost interconnection layer in contact with the barrier layer on the interlevel insulation film. The barrier layer to be formed in the barrier layer forming step has a laminate structure comprising a first sublayer provided in contact with the first interconnection layer to reduce a contact resistance, a second sublayer provided in contact with the second interconnection layer to improve a bonding strength, and a third sublayer provided between the first sublayer and the second sublayer.

The first sublayer, the second sublayer and the third sublayer are preferably a first tantalum sublayer, a second tantalum sublayer and a tantalum nitride sublayer, respectively.

The barrier layer forming step preferably comprises a sequential sputtering step of forming the first tantalum sublayer, the tantalum nitride sublayer and the second tantalum sublayer by a sequential sputtering process. The sequential sputtering step preferably comprises the steps of: performing the sputtering process with the use of a tantalum target in a treatment chamber to form the first tantalum sublayer; introducing nitrogen gas into the treatment chamber and performing the sputtering process with the use of the tantalum target in a nitrogen atmosphere to form the tantalum nitride sublayer; and removing the nitrogen gas from the treatment chamber and performing the sputtering process with the use of the tantalum target to form the second tantalum sublayer.

That is, the tantalum sublayer is formed without the introduction of the nitrogen gas in the treatment chamber at the initial stage of the sequential sputtering process, and then the nitrogen gas is introduced into the treatment chamber. At the initial stage of the introduction of the nitrogen gas, virtually no nitrogen gas is present in the treatment chamber, and the concentration of the nitrogen gas in the treatment chamber is increased with time. As a result, a portion of the tantalum nitride sublayer formed adjacent to the first tantalum sublayer has a relatively low nitrogen atom density. Thereafter, the nitrogen gas is removed from the treatment chamber, whereby the second tantalum sublayer is formed.

The interlevel insulation film forming step preferably comprises the step of forming a silicon nitride film which entirely covers a surface of the interlevel insulation film.

The method preferably further comprises the step of forming a polyimide resin film which covers the second interconnection layer and the interlevel insulation film. The polyimide resin film forming step may comprise the step of applying a polyimide resin.

The method preferably further comprises the step of forming a silicon nitride film which covers the second interconnection layer and the interlevel insulation film.

The foregoing and other objects, features and effects of the present invention will become more apparent from the following description of the preferred embodiments with reference to the attached drawings.

DESCRIPTION OF THE PREFERRED EMBODIMENTS

Figure 1:
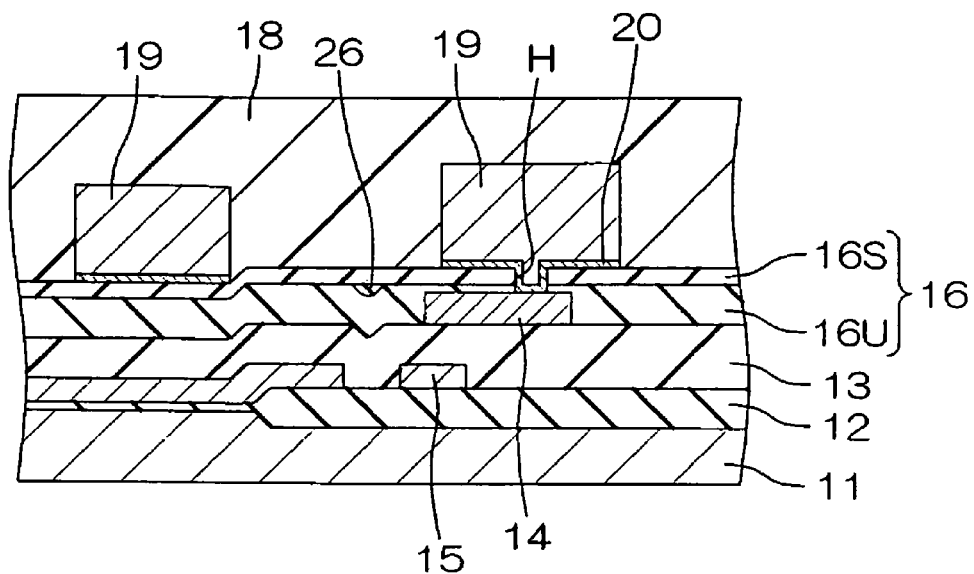
FIG. 1 is a sectional view illustrating the construction of a semiconductor device according to one embodiment of the present invention.

FIG. 1 is a sectional view illustrating the construction of a semiconductor device according to one embodiment of the present invention. The semiconductor device has a polysilicon interconnection 15 provided on a silicon substrate 11 formed with a field oxide film 12.

An interlevel insulation film 13 entirely covers the field oxide film 12 and the polysilicon interconnection 15. An aluminum interconnection layer 14 is provided as a first interconnection layer on the interlevel insulation film 13. The aluminum interconnection layer 14 and the interlevel insulation film 13 are entirely covered with an interlevel insulation film 16 of a laminate structure which includes a USG (undoped silicate glass) layer 16U and a silicon nitride film 16S covering the entire surface of the USG layer 16U. A gold interconnection layer (interconnection layer of gold) 19 is provided as a second interconnection layer (uppermost interconnection layer) on the interlevel insulation film 16. The gold interconnection layer 19 and the interlevel insulation film 16 are entirely covered with a polyimide resin film 18, which has a planar surface.

The interlevel insulation film 16 has a contact hole H formed therein at a predetermined position to expose a part of the aluminum interconnection layer 14. Interlevel connection between the aluminum interconnection layer 14 and the gold interconnection layer 19 is achieved through the contact hole H.

Figure 2:
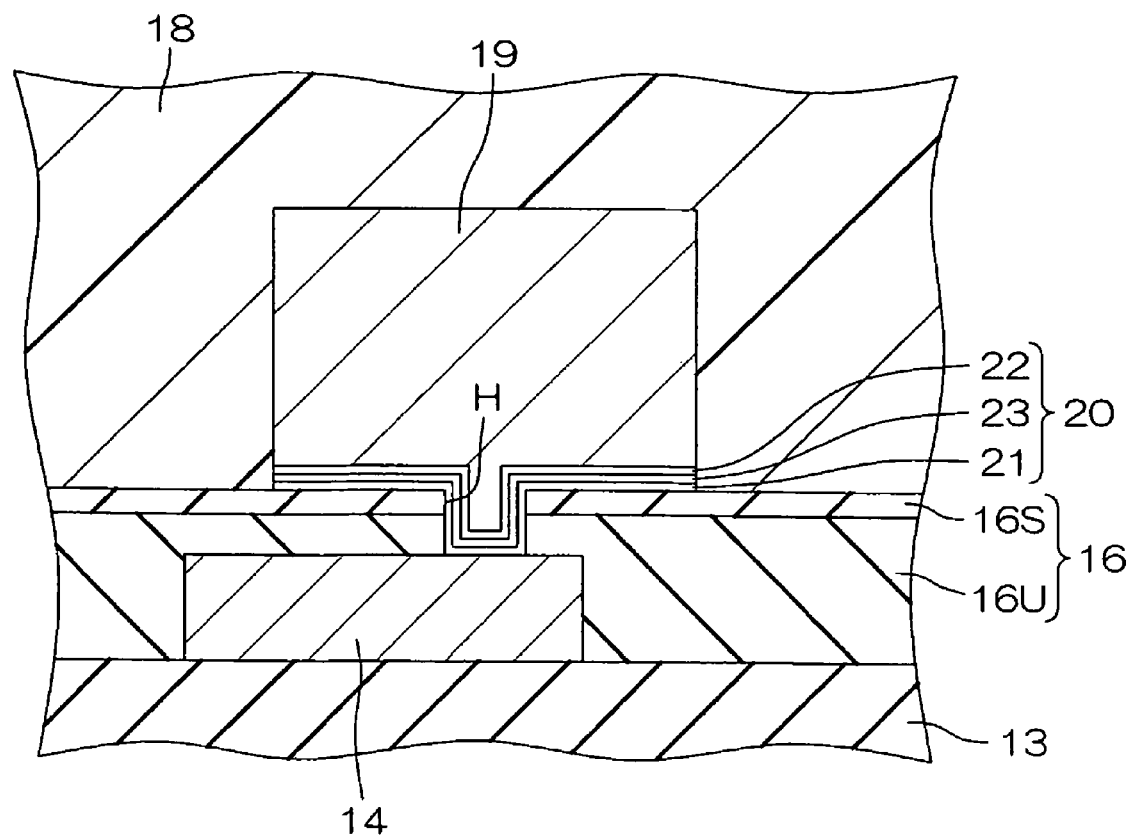
FIG. 2 is a diagram for explaining the structure of a barrier layer.

A barrier layer 20 for preventing diffusion of gold of the gold interconnection layer 19 is provided in the contact hole H between the gold interconnection layer 19 and the aluminum interconnection layer 14. As illustrated on a greater scale in FIG. 2, the barrier layer 20 has a laminate structure including a first tantalum sublayer 21 connected to the aluminum interconnection layer 14, a second tantalum sublayer 22 connected to the gold interconnection layer 19, and a tantalum nitride sublayer 23 provided between the first and second tantalum sublayers 21 and 22.

Figure 3:
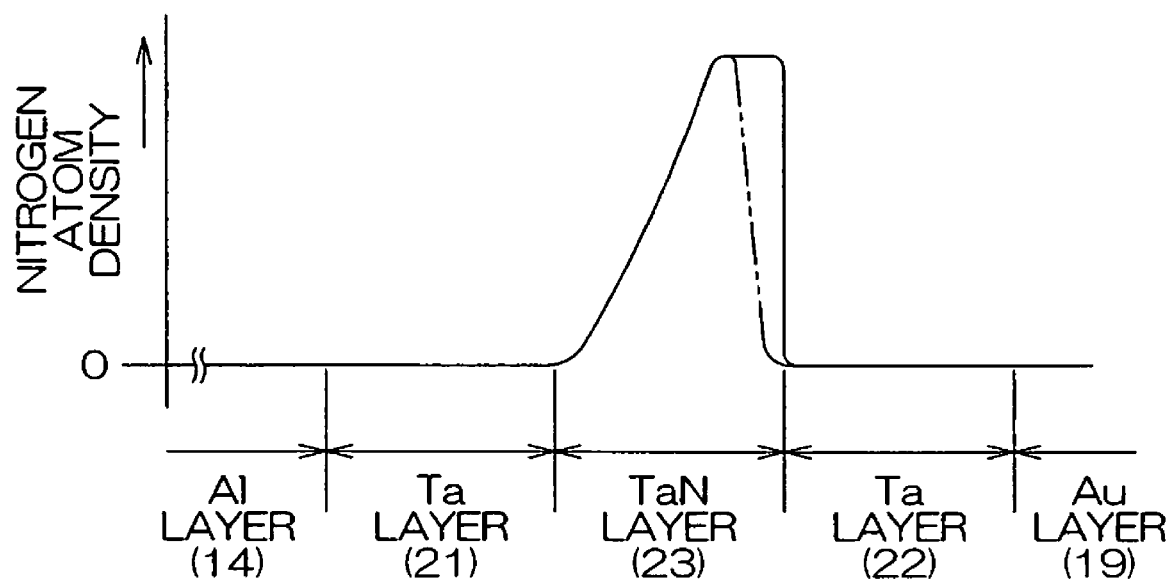
FIG. 3 is a diagram illustrating a nitrogen atom density distribution in the barrier layer.

A nitrogen atom density distribution in the tantalum nitride sublayer 23 is such that a nitrogen atom density is the lowest at an interface between the first tantalum sublayer 21 and the tantalum nitride sublayer 23 and progressively increases toward the second tantalum sublayer 22 as shown in FIG. 3. In a portion of the tantalum nitride sublayer 23 adjacent to the second tantalum sublayer 22, the nitrogen atom density may steeply decrease (or decrease stepwise) to zero at an interface between the tantalum nitride sublayer 23 and the second tantalum sublayer 22, or may progressively decrease toward the gold interconnection layer 19 as indicated by a two-dot-and-dash line in FIG. 3. In this case, a portion of the tantalum nitride sublayer 23 having a nitrogen atom density of zero is regarded as the interface between the tantalum nitride sublayer 23 and the second tantalum sublayer 22.

With this arrangement, gold of the gold interconnection layer 19 is effectively prevented from diffusing into the aluminum interconnection layer 14 mainly by the function of the tantalum nitride sublayer 23, even if the semiconductor device is allowed to stand in a high temperature environment in an alloying process after the production of the semiconductor device. Further, the barrier layer 20 exhibits a high corrosion resistance even in a pressure cooker test environment. In addition, the barrier layer 20 is allowed to have a very small thickness as compared with a barrier layer constituted by a tantalum layer alone.

Since the tantalum nitride sublayer 23 does not directly contact the aluminum interconnection layer 14, an increase in the resistance of the aluminum interconnection layer 14 can be prevented which may otherwise occur due to the nitriding of the aluminum interconnection layer 14. Further, the nitrogen atom density of the tantalum nitride sublayer 23 decreases toward the aluminum interconnection layer 14, so that the resistance of the aluminum interconnection layer 14 can assuredly be kept low.

Since the second tantalum sublayer 22 is disposed on the side of the gold interconnection layer 19 which has poorer adhesion to the nitride film, the gold interconnection layer 19 and the barrier layer 20 can be bonded to each other with a sufficient bonding strength.

Figure 4D:
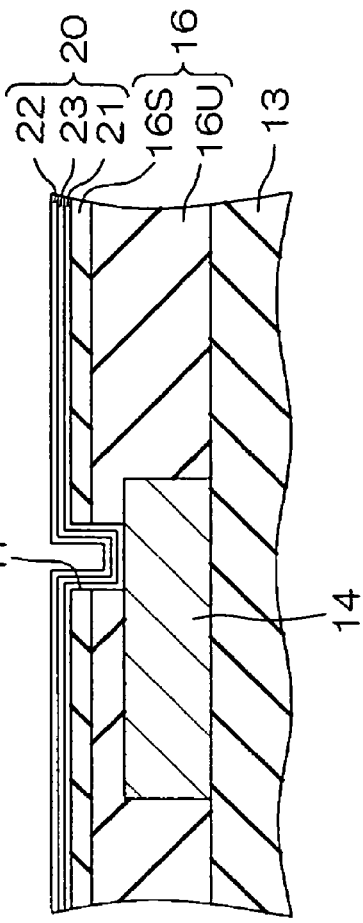
FIGS. 4($a$) to 4($e$) are sectional views illustrating a process sequence for production of the semiconductor device.
Figure 4E:
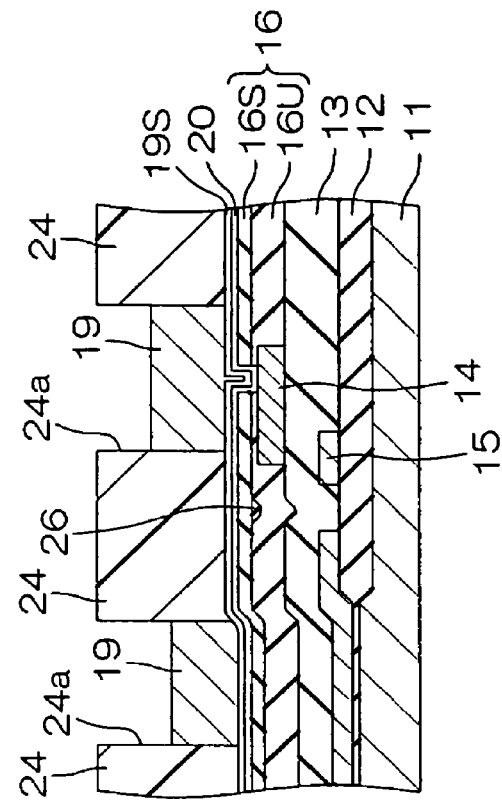
Figure 4A:
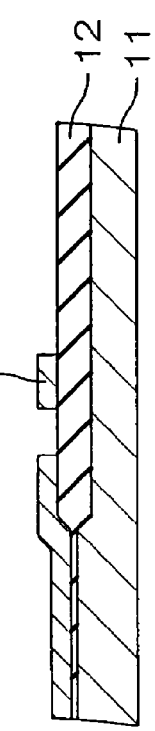

FIGS. 4(a) to 4(e) are sectional views illustrating a process sequence for production of the aforesaid semiconductor device. As shown in FIG. 4(a), a device isolation film 12 is first formed in a surface of a silicon substrate 11 to define a device region, and an interconnection 15 of a polysilicon film is formed in the device region.

Figure 4B:
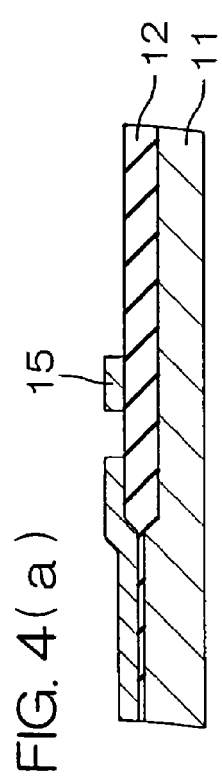

In turn, as shown in FIG. 4(b), an interlevel insulation film 13 of a BPSG film is formed over the resulting substrate, and an aluminum interconnection layer 14 which is connected to the polysilicon interconnection 15 through a contact hole (not shown) is formed on the interlevel insulation film 13.

Figure 4C:
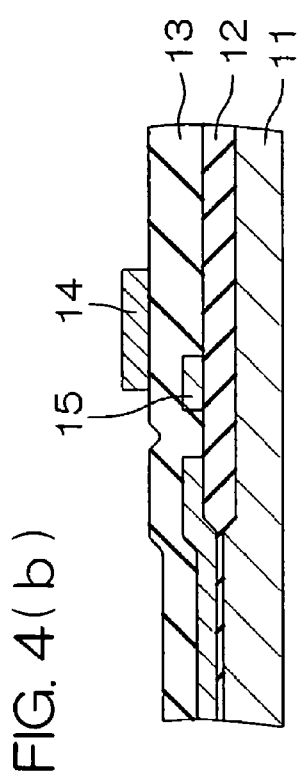

Thereafter, as shown in FIG. 4(c), a USG (undoped silicate glass) is deposited on the resulting substrate by a CVD (chemical vapor deposition) method or the like to form a USG layer 16U, and further a silicon nitride film 16S is formed over the USG layer 16U by a plasma CVD method. Thus, an interlevel insulation film 16 is formed. A contact hole H is formed at a predetermined position in the interlevel insulation film 16.

Then, a barrier layer 20 is formed over the resulting substrate by a sputtering method as illustrated on a greater scale in FIG. 4(d). More specifically, the silicon substrate 11 subjected to the process steps shown in FIGS. 4(a) to 4(c) is placed in a treatment chamber. In the treatment chamber, a first tantalum sublayer 21, a tantalum nitride sublayer 23 and a second tantalum sublayer 22 are sequentially formed in this order over the resulting substrate by a sequential sputtering process with the use of a tantalum target. At the initial stage of the sequential sputtering process, nitrogen gas is not introduced into the treatment chamber. Thus, tantalum atoms are carried onto the silicon substrate 11 to form the first tantalum sublayer 21. The tantalum atoms initially impinge on the surface of the aluminum interconnection layer 14 to remove a surface oxide and the like. Then, the tantalum atoms are deposited on the surface of the aluminum interconnection layer 14 thus activated.

Thereafter, nitrogen gas is supplied into the treatment chamber, whereby tantalum atoms and nitrogen atoms are carried onto the first tantalum sublayer 21 to form the tantalum nitride sublayer 23. Immediately after the start of the supply of the nitrogen gas, only a small amount of the nitrogen gas is present in the treatment chamber. The number of nitrogen atoms present in the treatment chamber increases with time. Therefore, the tantalum nitride sublayer 23 has a nitrogen atom density distribution as shown in FIG. 3.

Then, the sputtering process is continuously performed while the nitrogen gas is exhausted from the treatment chamber. Thus, tantalum atoms are carried onto the tantalum nitride sublayer 23 and deposited on the tantalum nitride sublayer 23 to form the second tantalum sublayer 22.

In turn, as shown in FIG. 4(e), a gold seed layer 19S is formed over the resulting substrate. The formation of the seed layer 19S may be achieved through the sequential sputtering process by switching the target from tantalum to gold in the treatment chamber employed for the formation of the barrier layer 20.

Then, a resist 24 is formed as covering the entire seed layer 19S. An opening 24a corresponding to a gold interconnection layer 19 is formed in the resist 24. In this state, a gold electrolytic plating process is performed, whereby the gold interconnection layer 19 grows in the opening 24a.

Thereafter, the resist 24 is removed, and a part of the seed layer 19S and a part of the barrier layer 20 not covered with the gold interconnection layer 19 are etched away. Then, a 2 μm thick polyimide resin film 18 is formed as a passivation film by coating. Thus, a semiconductor device having a construction as shown in FIG. 1 is provided.

Further, openings may be formed at predetermined positions in the polyimide resin film 18 above the gold interconnection layer 19 for connection between the gold interconnection layer 19 and external connection terminals (not shown) by bonding wires.

Figure 5:
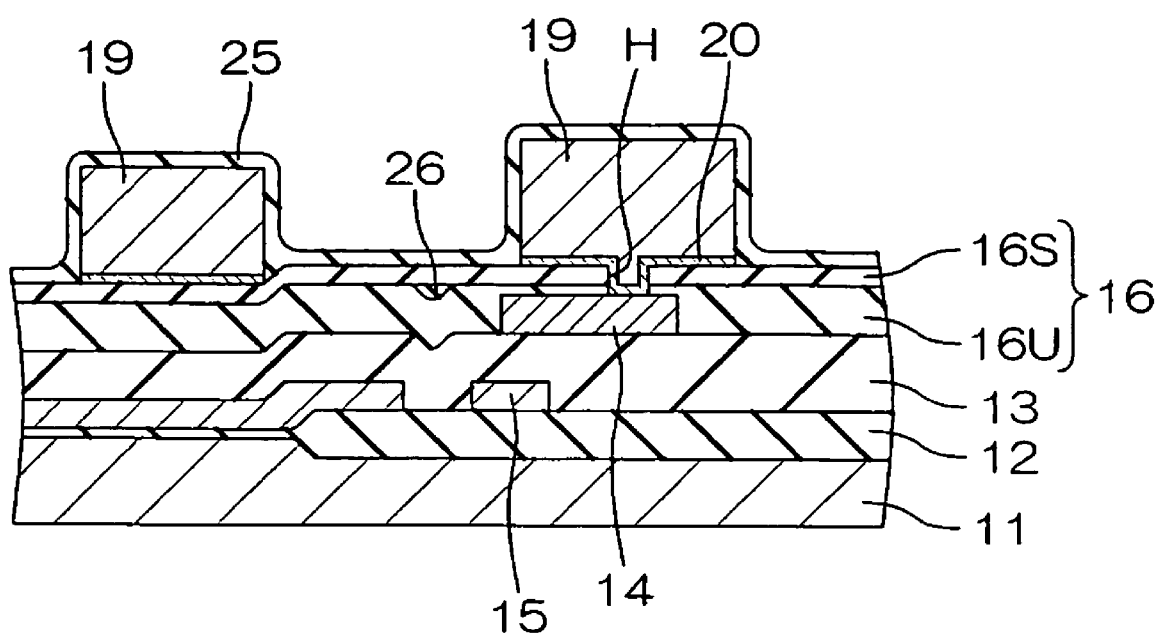
FIG. 5 is a sectional view illustrating the construction of a semiconductor device according to another embodiment of the present invention.

FIG. 5 is a sectional view for explaining the construction of a semiconductor device according to another embodiment of the present invention. In FIG. 5, components corresponding to those shown in FIG. 1 will be denoted by the same reference characters as in FIG. 1.

In this embodiment, a silicon nitride film 25 is provided instead of the polyimide resin film 18 as the passivation film. That is, after the resist 24 is removed and unnecessary portions of the seed layer 19S and the barrier layer 20 are etched away in the state shown in FIG. 4(e), the silicon nitride film 25 is formed over the resulting substrate, for example, by a plasma CVD method. Thus, a semiconductor device as shown in FIG. 5 is provided.

With this arrangement, the corrosion resistance of the semiconductor device can further be improved, because the silicon nitride film 25 herein employed is highly dense and has a high passivation effect. When the silicon nitride film 25 is formed by the plasma CVD method, the semiconductor device is allowed to stand in a high temperature environment. Even in this case, the diffusion of gold into the aluminum interconnection layer 14 from the gold interconnection layer 19 is prevented.

While the two embodiments of the present invention have thus been described, the invention may be embodied in any other ways. Although the polyimide resin film 18 is employed as the passivation film in the embodiment shown in FIG. 1 and the silicon nitride film 25 is employed as the passivation film in the embodiment shown in FIG. 5, neither the polyimide resin film 18 nor the silicon nitride film 25 may be provided, i.e., no passivation film may be provided. Even in this case, the gold interconnection layer 19 exposed to a surface of the semiconductor device has a sufficient corrosion resistance, and the surface of the interlevel insulation film 16 is constituted by the silicon nitride film 16S having a high passivation effect. Further, the barrier layer 20 is excellent in corrosion resistance. Therefore, the semiconductor device totally has a sufficient corrosion resistance.

Besides the BPSG film, a PSG film (a silicon oxide film doped with phosphorus) or a USG film may be employed as the interlevel insulation film 13.

Further, an organic SOG layer 26 (see FIGS. 1 and 5) constructed by an organic insulative silicon compound (organic SOG) which permits easy formation of a thicker film may be applied on the deposited USG film 16U as filling a recess in an upper surface of the USG layer 16U by an SOG (spin on glass) method, and then the silicon nitride film 16S may be formed by a high density plasma CVD method.

While the present invention has been described in detail by way of the embodiments thereof, it should be understood that the foregoing disclosure is merely illustrative of the technical principles of the present invention but not limitative of the same. The spirit and scope of the present invention are to be limited only by the appended claims.

This application corresponds to Japanese Patent Application No. 2003-291642 filed with the Japanese Patent Office on Aug. 11, 2003, the disclosure of which is incorporated herein by reference.

What is claimed is:

1. A semiconductor device production method for producing a semiconductor device in which a first interconnection layer and a second interconnection layer stacked with an intervention of an interlevel insulation film are electrically connected to each other through an interlevel connection opening formed in the interlevel insulation film, the method comprising the steps of:
    forming the first interconnection layer on a semiconductor substrate;
    forming the interlevel insulation film to cover the first interconnection layer;
    forming the interlevel connection opening at a predetermined position in the interlevel insulation film to expose a part of the first interconnection layer at a bottom of the interlevel connection opening, the interlevel connection opening having an inner side wall surface;
    forming a barrier layer in the interlevel connection opening, the barrier layer having a laminate structure including a first sublayer provided in contact with the first interconnection layer to reduce a contact resistance, a second sublayer provided in contact with the second interconnection layer to improve a bonding strength, and a third sublayer provided between the first sublayer and the second sublayer; and
    forming the second interconnection layer from gold as an uppermost interconnection layer in contact with the barrier layer on the interlevel insulation film, wherein
    the first sublayer, the second sublayer and the third sublayer are each formed so as to cover the part of the first interconnection layer at the bottom of the interlevel connection opening, to cover the inner side wall surface of the interlevel connection opening, and to extend over a surface of the interlevel insulation film under the second interconnection layer, and
    a nitrogen atom density distribution in the second sublayer is such that the nitrogen atom density is lowest at an interface between the first sublayer and the second sublayer and progressively increases toward the third sublayer.

2. A semiconductor device production method as set forth in claim 1, wherein the first sublayer, the second sublayer and the third sublayer are a first tantalum sublayer, a second tantalum sublayer and a tantalum nitride sublayer, respectively.

3. A semiconductor device production method as set forth in claim 2,
    wherein the barrier layer forming step includes the step of forming the first tantalum sublayer, the tantalum nitride sublayer and the second tantalum sublayer by a sequential sputtering process,
    wherein the sequential sputtering step includes the steps of:
    performing the sputtering process with the use of a tantalum target in a treatment chamber to form the first tantalum sublayer;
    introducing nitrogen gas into the treatment chamber and performing the sputtering process with the use of the tantalum target in a nitrogen atmosphere to form the tantalum nitride sublayer; and
    removing the nitrogen gas from the treatment chamber and performing the sputtering process with the use of the tantalum target to form the second tantalum sublayer.

4. A semiconductor device production method as set forth in claim 1, wherein the interlevel insulation film forming step includes the step of forming a silicon nitride film which entirely covers a surface of the interlevel insulation film.

5. A semiconductor device production method as set forth in claim 1, further comprising the step of forming a polyimide resin film which covers the second interconnection layer and the interlevel insulation film.

6. A semiconductor device production method as set forth in claim 1, further comprising the step of forming a silicon nitride film which covers the second interconnection layer and the interlevel insulation film.

* * * * *